United States Patent
Weiss

(10) Patent No.: US 8,406,852 B2
(45) Date of Patent: Mar. 26, 2013

(54) MRI INVOLVING FORWARDLY AND REVERSELY POLARISED RF EXCITATION

(75) Inventor: Steffen Weiss, Hamburg (DE)

(73) Assignee: Koninklijke Philips Electronics N.V., Eindhoven (NL)

( * ) Notice: Subject to any disclaimer, the term of this patent is extended or adjusted under 35 U.S.C. 154(b) by 376 days.

(21) Appl. No.: 12/681,115

(22) PCT Filed: Oct. 2, 2008

(86) PCT No.: PCT/IB2008/054030
§ 371 (c)(1),
(2), (4) Date: Apr. 1, 2010

(87) PCT Pub. No.: WO2009/044361
PCT Pub. Date: Apr. 9, 2009

(65) Prior Publication Data
US 2010/0249572 A1    Sep. 30, 2010

(30) Foreign Application Priority Data
Oct. 5, 2007    (EP) ..................................... 07117985

(51) Int. Cl.
*A61B 5/055*    (2006.01)
(52) U.S. Cl. ......... 600/411; 600/424; 324/318; 324/322
(58) Field of Classification Search ................. 600/410, 600/411, 421–424; 324/307, 309, 318, 322
See application file for complete search history.

(56) References Cited

U.S. PATENT DOCUMENTS

| | | | | |
|---|---|---|---|---|
| 4,638,252 A | * | 1/1987 | Bradshaw | ..................... 324/318 |
| 5,473,252 A | | 12/1995 | Renz et al. | |
| 6,608,480 B1 | | 8/2003 | Weyers | |
| 6,879,158 B2 | * | 4/2005 | Zhu | ............................... 324/318 |
| 2003/0120150 A1 | | 6/2003 | Govari | |
| 2005/0140369 A1 | | 6/2005 | Feiweier et al. | |

FOREIGN PATENT DOCUMENTS

| | | |
|---|---|---|
| WO | 2004092760 A1 | 10/2004 |
| WO | 2005103748 A1 | 11/2005 |
| WO | 2005120336 A1 | 12/2005 |

OTHER PUBLICATIONS

Celik et al:"A Novel Catheter Tracking Method Using Reversed Polarization"; Proceedings of the International Society for Magnetic Resonance in Medicine, May 2006, vol. 14, p. 264.
Alagappan et al: "Degenerate Mode Band-Pass Birdcage Coil for Accelerated Parallel Excitation"; Magnetic Resonance in Medicine, vol. 57, May 29, 2007, pp. 1148-1158.
Celik et al: "A Catheter Tracking Method Using Reverse Polarization for MR-Guided Interventions"; Magnetic Resonance in Medicine, vol. 58, 2007, pp. 1224-1231.

* cited by examiner

*Primary Examiner* — Ruth S Smith

(57) ABSTRACT

A system for MR imaging of a body placed in an examination volume including main coils for establishing a substantially homogeneous main magnetic field in the examination volume, gradient coils for generating switched magnetic field gradients superimposed upon the main magnetic field, RF coils for radiating RF signals towards the body, a controller for controlling the generation of the magnetic field gradients and the RF signals, a processor for forming MR images from received MR signal samples, and an object having an RF antenna for receiving RF signals generated by the RF coils which are configured to generate circularly polarized RF signals having a selectable sense of rotation.

12 Claims, 2 Drawing Sheets

MRI INVOLVING FORWARDLY AND REVERSELY POLARISED RF EXCITATION

FIELD OF THE INVENTION

The invention relates to a device for magnetic resonance (MR) imaging of a body placed in an examination volume.

Furthermore, the invention relates to a method for MR imaging and to a computer program for an MR device.

BACKGROUND OF THE INVENTION

In MR imaging, sequences consisting of RF signals (also referred to as $B_1$) and switched magnetic field gradients are applied to an object (a patient) placed in a homogeneous magnetic field within an examination volume of an MR device. In this way, MR signals are generated, which are scanned by means of RF receiving antennas in order to obtain information from the object and to reconstruct images thereof. Since its initial development, the number of clinically relevant fields of application of MR imaging has grown enormously. MR imaging can be applied to almost every part of the body, and it can be used to obtain information about a number of important functions of the human body. The imaging sequence, which is applied during an MR scan, plays a significant role in the determination of the characteristics of the reconstructed image, such as location and orientation in the object, dimensions, resolution, signal-to-noise ratio, contrast, sensitivity for movements, etcetera. An operator of an MRI device has to choose the appropriate sequence and has to adjust and optimize its parameters for the respective application.

In interventional and intraoperative MR imaging high-performance computing and novel therapeutic devices are combined. These techniques permit the execution of a wide range of interactive MR guided interventions and surgical procedures. A basic issue of interventional MR imaging is the visualization and localization of instruments or surgical devices. This can be done either using active techniques, e.g. by means of RF micro coils attached to the tip of an instrument, or passive localization techniques that rely on local magnetic susceptibility induced image artifacts.

The active localization approach allows the immediate determination of the instrument coordinates and therefore allows robust tracking of instruments. It further enables functionalities like, e.g., image slice tracking. A drawback of active localization is that it implies a safety issue due to the presence of electrically conductive cables which may act as RF antennas and which may lead to dangerous tissue heating.

WO 2005/103748 A1 discloses a way to suppress the hazards associated with the induction of currents in the electrically conductive cables that are used as transmission lines for connecting auxiliary means, such as interventional instruments or RF surface coils, to the MR system. According to the conventional approach, inductors are introduced into the connecting cable. These inductors are coupled such that they form a transformer. Additionally, a tuning and matching network is integrated into the cable resembling a tuned blocking filter. This arrangement suppresses induced currents that would lead to dangerous heating of the cable.

A drawback associated with the known transformer-based transmission lines integrated, for example, into catheters or guidewires is that it involves a considerable hardware effort to build these devices.

An alternative approach is proposed by Celik et al. ("A Novel Catheter Tracking Method Using Reversed Polarization", in Proc. Intl. Soc. Mag. Reson. Med., vol. 14, 2006, page 264). Reverse circular polarisation is used to obtain an MR image of an RF coil which is attached as a resonant marker to an interventional instrument. Standard quadrature birdcage coils which are used as RF antennas in conventional MR systems are designed to receive only forward circularly polarised RF fields, because the protons in the examined body have a forward polarisation as well. This is due to the positive gyromagnetic ratio of the hydrogen nuclei. Therefore, a standard birdcage coil modified to receive only reverse circularly polarised RF signals would pick up no MR signal from the body at all. However, the RF coil attached to the interventional instrument picks up the MR signals from the examined body and radiates a linearly polarised RF field. A linearly polarised radiation can be considered as a superposition of a forward and a reverse circularly polarised RF field. Therefore, the modified quadrature birdcage coil, which is designed to receive only reverse polarised RF radiation, picks up the signal which is radiated from the RF coil attached to the interventional instrument, but no signal from the surrounding body tissue is obtained. In this way, a background-free image showing only the position of the interventional instrument is generated.

A drawback of the afore-described technique is that a specially designed receive-only quadrature body coil has to be used to pick up the reverse circularly polarised RF signals generated by the RF coil attached as a resonant marker to the interventional instrument. The RF coil is excited indirectly via the nuclear magnetization of the body tissue during the imaging and localisation procedure. Hence, the SNR (signal to noise ratio) is comparatively low, which is a further disadvantage of the known method.

A further option to provide a signal or power transmission path between an MR apparatus and an interventional device (or any other auxiliary equipment) without interfering with the MR imaging procedure is the use of off-resonant RF. However, off-resonant RF also has several disadvantages. Off-resonant RF can not be easily converted to on-resonant RF. Furthermore, additional RF transmission and reception means are required if the off-resonant RF is outside the bandwidth of the conventional RF equipment of the MR apparatus. On the other hand, if the off-resonant RF is within the bandwidth of the customary RF chain of the MR apparatus, unwanted interference with the nuclear spin system may occur.

SUMMARY OF THE INVENTION

Therefore, it is readily appreciated that there is a need for an improved device and method for MR imaging. It is consequently an object of the invention to provide an MR system and an MR method enabling a safe, reliable and non-interfering transmission of signals and/or power to auxiliary means located within the examination volume.

In accordance with the present invention, a system for MR imaging of a body placed in an examination volume is disclosed. The system comprises means for establishing a substantially homogeneous main magnetic field in the examination volume, means for generating switched magnetic field gradients superimposed upon the main magnetic field, transmission means for radiating RF signals towards the body, control means for controlling the generation of the magnetic field gradients and the RF signals, means for receiving and sampling MR signals, reconstruction means for forming MR images from the signal samples, and auxiliary means having an RF antenna for receiving RF signals generated by the transmission means. According to the invention, the MR system is arranged to generate circularly polarised RF signals via the transmission means, which RF signals have a selectable sense of rotation.

The MR system of the invention uses reverse circularly polarised RF signals to transmit signals or power via the existent RF transmission hardware of the MR apparatus to auxiliary equipment located within the examination volume. The reverse circularly polarised RF signals generate a correspondingly reverse polarized $B_1$ field within the examination volume which does not cause any excitation of nuclear magnetization. This is because—as mentioned above—the nuclei having a positive gyromagnetic ratio are not affected by the reverse polarized $B_1$ field. Therefore, the signal or power transmission does not interfere with the actual MR imaging procedure. In accordance with the invention, the sense of rotation of the RF signals can be selected. This means that the polarisation direction can be switched as required between forward and reverse. In the forward mode, first RF signals having a forward circular polarization are generated for exciting the nuclear magnetization within the examined body. MR imaging is performed in this mode as usual. In the reverse mode, second RF signals having a reverse circular polarization are generated for inducing a voltage within the RF antenna of the auxiliary means without exciting nuclear magnetization and, thus, without interfering with the MR signal generation and acquisition.

In accordance with a preferred embodiment of the invention, the MR system is arranged, for example by a corresponding programming of the control means and/or the reconstruction means, to acquire a localisation signal generated by the auxiliary means as a response to the second RF signal and to compute the position of the auxiliary means from the localisation signal. A safe active device tracking technique is realized by this embodiment of the invention. The auxiliary equipment to be localized, which might be, for example, a catheter or a guide wire or any other type of interventional instrument, is provided with an RF antenna forming a resonant marker (comprising, for example, a solenoid coil and a capacitor). For active tracking, RF signals having a reverse polarisation are sent towards the examined body into which the device to be localised is introduced. These RF signals will excite the resonant marker resulting in a strong local $B_1$ field having a linear polarisation. The linearly polarized local $B_1$ field thereupon excites nuclear magnetization within the body tissue in the close vicinity of the resonant marker. By a subsequent data acquisition, MR signals are received only from the direct surroundings of the markers without any background signals from the remainder of the body tissue. For the purpose of device tracking, projections in the x-, y-, and z-directions may be simply acquired and reconstructed. Alternatively, a complete MR image can be acquired and reconstructed, which shows image intensity only at the positions of the markers. Such an MR image can be used to compute a color overlay on a conventionally acquired MR image in order to visualize the positions of the markes in relation to the anatomic features of the examined body. The device tracking approach of the invention has the advantage that it can be used with any RF coil for reception including surface coil arrays. In contrast to the above-described known approach it does not rely on an additional dedicated RF body coil for MR signal reception. A further advantage is that the technique of the invention provides an improved SNR. This is because the intensity and duration of the reversely polarised RF signals can be chosen to result in a maximum excitation of magnetization the vicinity of the resonant markers.

In accordance with a further embodiment of the invention, the auxiliary means is an MR surface coil. The technique of the invention can be used to power and/or to control a wireless surface coil without interfering with the MR imaging procedure. Power and control signals may be wirelessly transmitted from a body coil of the MR apparatus to a surface coil array, wherein the surface coil array is used as a transmit coil during the actual MR imaging procedure. Each element of the surface coil array may be provided with an externally controlled Q-switch in order to control the intensity of the RF signals emitted by the respective element. Because the control signal for controlling the Q-switch has only a low power, it can be realized, for example, by conventional off-resonant wireless techniques. Alternatively, the control signal can be transmitted using reversely polarised RF signals generated in a time-interleaved fashion with the actual (forwardly polarised) RF excitation.

The implementation of the invention in conventional MR scanners would require a certain modification of the RF transmission hardware. Conventional quadrature body coils are fed via a so-called quadrature hybrid splitting the RF current supplied by the power amplifier into two parts of equal power and adding a 90° phase shift to one of the parts. The two parts are fed into the coil at two distinct points. A selectable sense of rotation of the circularly polarized RF radiation emitted by the body coil can be realized by simply swapping the two parts of the RF currents. For this purpose, the usually hard-wired quadrature hybrid may be replaced by a switchable pendant.

According to a preferred embodiment of the invention, the transmission means of the MR system comprises a plurality of RF coils forming a multi-coil array, wherein each RF coil is driven by an individual RF amplifier and/or an individual RF waveform generator. Recently, MR systems with multi-element RF coil arrays have been introduced for improved MR imaging. Thereby, the multi-element RF coil array is based on a setup of single RF coils. For example, $B_1$ homogeneity can be controlled during the imaging sequence so as to compensate for varying effects on the field distribution which are due to the different dielectric properties of the examined body. In order to achieve a selectable $B_1$ distribution within the examination volume, the single coil elements are driven via separate transmit channels by which the phases and amplitudes of the radiated RF signals can be individually set. The use of such a multi-coil array for implementing the present invention is straightforward. The generation of reversely polarized RF signals can simply be achieved by prescribing the appropriate waveforms fed to the individual RF coils in the software of the MR apparatus. Such a system can switch without any delay between forward and reverse polarisation, and even the simultaneous transmission of both polarisations is possible.

The invention not only relates to an MR device but also to a method for MR imaging of at least a portion of a body placed in an examination volume of an MR system. The method comprising the following steps:
  exciting nuclear magnetization within the body by generating a series of first RF signals and switched magnetic field gradients, the first RF signals having a forward circular polarization,
  generating at least one second RF signal having a reverse circular polarization for inducing a voltage within an RF antenna of an auxiliary equipment of the MR system without exciting nuclear magnetization within the body,
  acquiring MR signals from the body, and
  reconstructing an MR image from the acquired MR signals.

A computer program adapted for carrying out the imaging procedure of the invention can advantageously be implemented on any common computer hardware, which is presently in clinical use for the control of magnetic resonance scanners. The computer program can be provided on suitable data carriers, such as CD-ROM or diskette. Alternatively, it can also be downloaded by a user from an Internet server.

BRIEF DESCRIPTION OF THE DRAWINGS

The enclosed drawings disclose preferred embodiments of the present invention. It should be understood, however, that the drawings are designed for the purpose of illustration only and not as a definition of the limits of the invention. In the drawings.

DETAILED DESCRIPTION OF EXEMPLARY EMBODIMENTS

Figure 1:
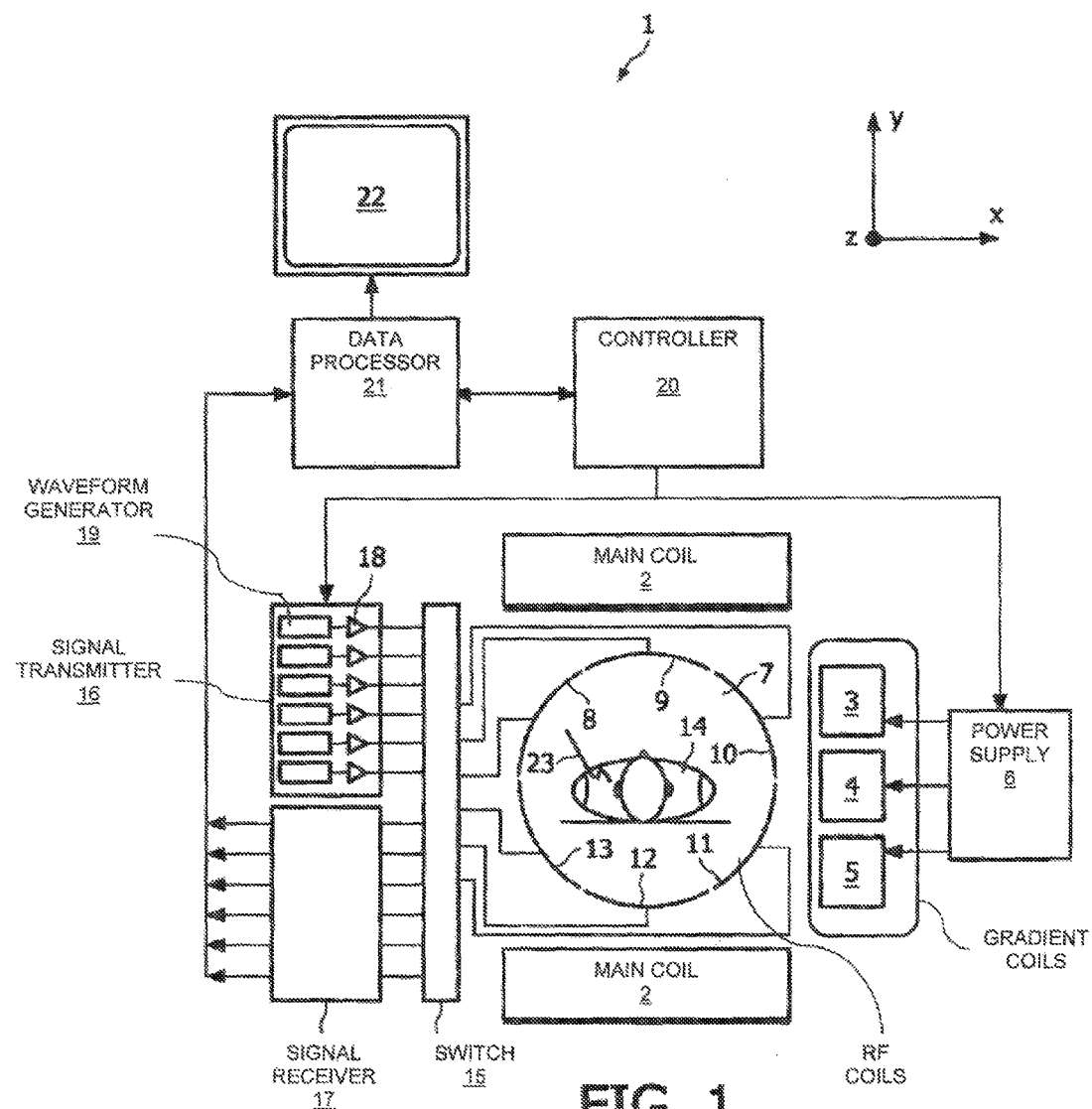
FIG. 1 shows an MR scanner according to the invention.

In FIG. 1 a magnetic resonance imaging system 1 in accordance with the present invention is shown as a block diagram. The apparatus 1 comprises a set of main magnetic coils 2 for generating a stationary and homogeneous main magnetic field, and three sets of gradient coils 3, 4 and 5 for superimposing additional magnetic fields with controllable strength and having a gradient in a selected direction. Conventionally, the direction of the main magnetic field is labelled the z-direction, the two directions perpendicular thereto the x- and y-directions. The gradient coils 3, 4, 5 are energized via a power supply 6. The apparatus 1 further comprises an RF multi-coil array for generating $B_1$ fields in an examination volume 7. The RF multi-coil array comprises six independent coils 8, 9, 10, 11, 12, 13 which are arranged adjacent to each other on a cylindrical surface around the examination volume 7. The coils 8, 9, 10, 11, 12, 13 are used for emitting radio frequency (RF) signals to a body 14. Each of the six coils 8, 9, 10, 11, 12, 13 is connected to an RF switching module 15. Via the switching module 15 the relevant coils 8, 9, 10, 11, 12, 13 are connected to either a transmission module 16 or to a signal reception module 17, that is, in dependence of the mode of operation of the device (either transmit mode or receive mode). For each RF coil 8, 9, 10, 11, 12, 13 the MR system 1 has an individual RF amplifier 18 and a waveform generator 19. The reception module 17 comprises sensitive pre-amplifiers, a demodulator and a digital sampling unit. The transmission module 16 and the power supply 6 for the gradient coils 3, 4 and 5 are controlled by a control system 20 to generate the actual imaging sequence in accordance with the above-described invention. The control system is usually a microcomputer with a memory and a program control. For the practical implementation of the invention it comprises a programming with a description of an imaging procedure wherein forwardly and reversely polarised $B_1$ fields are generated as required by appropriately controlling the waveform generators 19 and amplifiers 18. The signal reception module 17 is coupled to a data processing unit 21, for example a computer, for transformation of the received MR signals into an image. This image can be made visible, for example, on a visual display unit 22. In the depicted embodiment, a catheter 23 is introduced into the body 14. The catheter 23 is provided with an RF antenna (not depicted in FIG. 1) for receiving reversely polarised RF signals generated via the coils 8, 9, 10, 11, 12, 13.

Figure 2:
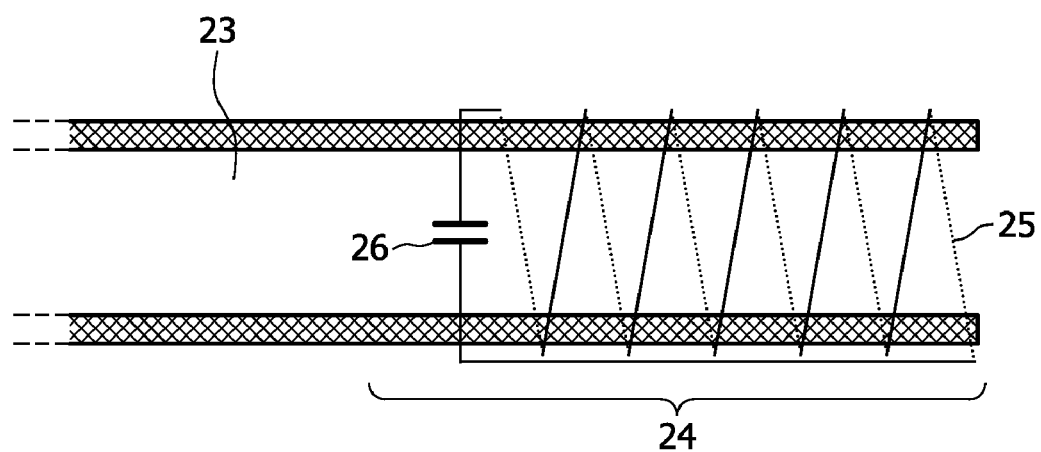
FIG. 2 shows an interventional instrument to be located in accordance with the invention.

FIG. 2 shows the tip of the catheter 23 in more detail. An RF antenna 24 serves as a resonant marker for localisation of the catheter tip. Antenna 24 comprises a solenoid coil 25, which is wound around the lumen of the catheter 23, and a capacitor 26. Coil 25 and capacitor 26 form a resonant circuit which is tuned to the Larmor frequency. For tracking of the catheter tip, RF signals having a reverse polarisation are sent via the RF coils 8, 9, 10, 11, 12, 13 of the MR apparatus (see FIG. 1) towards the examined body 14 into which the catheter 23 is introduced. These RF signals excite the resonant marker 24 resulting in a strong local $B_1$ field having a linear polarisation. The linearly polarized local $B_1$ field thereupon excites nuclear magnetization within the tissue of the body 14 tissue in the close vicinity of the catheter tip. As a next step, MR signals are acquired in a conventional manner, wherein MR signals are picked up only from the tissue surrounding the catheter tip without any background signals from the remainder of the body tissue. Projections in the x-, y-, and z-directions are acquired and reconstructed. Finally, the position of the catheter tip is derived from the reconstructed projections and indicated on the display unit 22 of the MR apparatus (see FIG. 1).

The invention claimed is:

1. A system for Magnetic Resonance (MR) imaging of a body placed in an examination volume, the system comprising:
    a first coil configured to establish a substantially homogeneous main magnetic field in the examination volume;
    a second coil configured to generate switched magnetic field gradients superimposed upon the main magnetic field;
    a third coil configured to radiate circularly polarized RF signals towards the body;
    a controller coupled to the first, second and third coils and configured to control the generation of the magnetic field gradients and a direction of circular polarization of the RF signals generated by the third coil to be selectable between forward polarization and reverse polarization;
    a receiver configured to receive and sample MR signals;
    a processor configured to form MR images from the MR signal samples; and
    an object having an RF antenna configured to receive RF signals generated by the third coil.

2. The system of claim 1, wherein the controller is configured to generate a series of first RF signals having a forward circular polarization for exciting nuclear magnetization within the body.

3. The system of claim 1, wherein the controller is configured to generate at least one second RF signal having a reverse circular polarization for inducing a voltage within the RF antenna of the object without exciting nuclear magnetization within the body.

4. The system of claim 3, wherein the processor is configured to acquire a localization signal generated by the object as a response to the second RF signal and to compute the position of the object from the localization signal.

5. The system of claim 1, wherein the object is an interventional instrument comprising a solenoid coil and a capacitor forming a resonant RF as the RF antenna.

6. The system of claim 1, wherein the object is an MR surface coil.

7. The system of claim 1 wherein the third coil comprises a plurality of RF coils forming a multi-coil array, each RF coil being driven by at least one of an individual RF amplifier and an individual RF waveform generator.

8. A method for Magnetic Resonance (MR) imaging of at least a portion of a body placed in an examination volume of an MR system, the method comprising acts of:

exciting nuclear magnetization within the body by generating with a first coil a first RF signal, the first RF signal having a forward circular polarization, switching the first coil to generate at least one second RF signal having a reverse circular polarization inducing a voltage within an RF antenna of an auxiliary equipment of the MR system without exciting nuclear magnetization within the body, acquiring MR signals from the body, and reconstructing an MR image from the acquired MR signals.

9. The method of claim 8, wherein the method comprises acts of acquiring a localization signal generated by the auxiliary equipment as a response to the second RF signal and computing the position of the auxiliary equipment within the examination volume from the localization signal.

10. The method of claim 8, comprising an act of generating a local field having a linear polarization by the voltage within the RF antenna thereby exciting a nuclear magnetization within the body tissue in a vicinity of the RF antenna.

11. A computer program stored on a non-transitory computer readable medium that when executed by a processor configures the processor to perform a method for operating a Magnetic Resonance (MR) system, wherein the computer program comprises instructions for performing acts of:

generating with a first coil a first RF signal having a forward circular polarization for exciting nuclear magnetization, switching the first coil to generate a second RF signal having a reverse circular polarization for inducing a voltage within an RF antenna of an auxiliary equipment of the MR system without exciting nuclear magnetization.

12. A processor configured to perform a method for operating a Magnetic Resonance(MR) system, the method comprising acts of:

generating through a first coil a first RF signal having a forward circular polarization for exciting nuclear magnetization, switching the first coil to generate a second RF signal having a reverse circular polarization for inducing a voltage within an RF antenna of an auxiliary equipment of the MR system without exciting nuclear magnetization.

* * * * *